United States Patent
Shin et al.

(10) Patent No.: US 9,347,621 B2
(45) Date of Patent: May 24, 2016

(54) LIGHT EMITTING MODULE AND LIGHTING DEVICE USING THE SAME

(71) Applicant: SAMSUNG ELECTRONICS CO., LTD., Suwon-si, Gyeonggi-do (KR)

(72) Inventors: Chang Ho Shin, Incheon (KR); Seok Chan Hong, Gyeonggi-do (KR); Sung Oh Ahn, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 366 days.

(21) Appl. No.: 13/905,977

(22) Filed: May 30, 2013

(65) Prior Publication Data

US 2014/0098544 A1    Apr. 10, 2014

(30) Foreign Application Priority Data

Oct. 4, 2012  (KR) .................. 10-2012-0110056

(51) Int. Cl.
*H01L 33/60* (2010.01)
*F21K 99/00* (2016.01)
*H05K 3/00* (2006.01)

(52) U.S. Cl.
CPC . *F21K 9/50* (2013.01); *H01L 33/60* (2013.01); *H05K 3/0052* (2013.01); *H05K 2201/0108* (2013.01); *H05K 2201/10106* (2013.01); *H05K 2201/209* (2013.01); *H05K 2201/2054* (2013.01)

(58) Field of Classification Search
CPC ............... H01L 33/60; H01L 2224/48137; H01L 27/153; H01L 2924/12041; H01L 25/0753; H01L 24/96; H01L 24/97; H01L 33/62; F21Y 2101/02; F21Y 2103/003; F21Y 2105/005; F21Y 2105/001; F21Y 2103/0062; F21K 9/00; F21S 48/215; F21S 48/13; F21S 48/218; G02F 1/133603; G02F 1/133602; H05K 1/0274; H05K 1/053; H05K 1/056; H05K 2201/2054; H05K 2201/10106
USPC ............... 362/217.02, 217.05, 219, 222–225, 362/237, 241, 249.01, 249.02, 326–328, 362/341, 540, 543–545
See application file for complete search history.

(56) References Cited

U.S. PATENT DOCUMENTS

| | | | | |
|---|---|---|---|---|
| 7,531,848 B2 * | 5/2009 | Shin | ................... | H01L 33/483 257/100 |
| 7,621,654 B2 * | 11/2009 | Nishimoto | ............. | H01L 24/97 257/98 |

(Continued)

FOREIGN PATENT DOCUMENTS

| JP | 2008-159908 A | 7/2008 |
|---|---|---|
| JP | 2009-152636 A | 7/2009 |

(Continued)

*Primary Examiner* — Hargobind S Sawhney
(74) *Attorney, Agent, or Firm* — McDermott Will & Emery LLP (57) ABSTRACT

A light emitting module includes a circuit board having a plurality of reflective portions arranged in one direction and connection portions connecting the plurality of reflective portions, light emitting devices mounted on the plurality of reflective portions, and lens units disposed to cover the light emitting devices within boundaries of surfaces, of the plurality of reflective portions, on which the light emitting devices are mounted. A width of each of the connection portions in the other direction, perpendicular to the one direction thereof, is smaller than a diameter of each of the lens units, thus reducing a generation of a dark portion.

20 Claims, 5 Drawing Sheets

(56) References Cited

U.S. PATENT DOCUMENTS

| | | | | |
|---|---|---|---|---|
| 7,626,211 | B2* | 12/2009 | Sugiura | H01L 33/60 257/100 |
| 8,148,746 | B2* | 4/2012 | Kobayakawa | H01L 25/0753 257/100 |
| 8,564,741 | B2* | 10/2013 | Kimura | G02F 1/133603 349/62 |
| 8,941,796 | B2* | 1/2015 | Yokota | G02F 1/133608 349/61 |
| 2006/0054912 | A1* | 3/2006 | Murakami | H01L 24/97 257/99 |
| 2007/0145398 | A1* | 6/2007 | Shin | H01L 33/483 257/98 |
| 2008/0185605 | A1* | 8/2008 | Wada | H01L 33/60 257/98 |
| 2009/0002988 | A1 | 1/2009 | Kim et al. | |
| 2011/0100686 | A1 | 5/2011 | Ryoichi et al. | |
| 2012/0136944 | A1 | 5/2012 | Stewart et al. | |
| 2012/0137338 | A1 | 5/2012 | Driggs et al. | |

FOREIGN PATENT DOCUMENTS

| | | |
|---|---|---|
| JP | 2010-210891 A | 9/2010 |
| KR | 10-2008-0018594 A | 2/2008 |
| KR | 10-2008-0040273 A | 5/2008 |
| KR | 10-2008-0081545 A | 9/2008 |
| KR | 10-2009-0059571 A | 6/2009 |
| KR | 10-2011-0039650 A | 4/2011 |
| KR | 10-2011-0041958 A | 4/2011 |

* cited by examiner

LIGHT EMITTING MODULE AND LIGHTING DEVICE USING THE SAME

CROSS-REFERENCE TO RELATED APPLICATIONS

This application claims the benefit of priority to Korean Patent Application No. 2012-0110056 filed on Oct. 4, 2012, in the Korean Intellectual Property Office, the disclosure of which is incorporated herein by reference.

TECHNICAL FIELD

The present disclosure relates to a light emitting module and a lighting device using the same.

BACKGROUND

A light emitting diode (LED), a type of semiconductor light emitting device, is a semiconductor device capable of generating light of various colors according to the recombination of electrons and holes at p and n type semiconductor junctions when current is applied thereto. Compared with a filament-based light emitting device, the semiconductor light emitting device has various advantages such as a longer lifespan, lower power consumption, excellent initial driving characteristics, high vibration resistance, and the like. These advantages make demand for the semiconductor light emitting device continue to grow. In particular, recently, a group III-nitride semiconductor capable of emitting short-wavelength blue light has come to prominence.

A light source module used for an LCD backlight, or the like, conventionally employs a cold cathode fluorescent lamp (CCFL). Use of mercury gas, however, incurs disadvantages in that it has a slow response speed and low color reproducibility (or a color gamut) and is not suitable for a light, thin, short, and small LCD panel. In comparison, an LED is environmentally-friendly, has a fast response speed, within the range of a few nano-seconds, to provide a high speed response, and is thus effective for a video signal stream, is available for impulsive driving, has a color gamut of 100% or higher, can arbitrarily change luminance, color temperature, or the like, by adjusting the quantity of light emitted by red, green and blue LEDs, and is suitable for a light, thin, short, and small LCD panel. As such, the LED has been actively employed as a light source module of a backlight.

As an expansive employment of a light emitting diode as a light emitting module for a backlight, a need exists for a method for enhancing uniformity of emitted light.

SUMMARY

An aspect of the present disclosure provides a light emitting module in which the generation of a dark portion is reduced to improve light uniformity.

Another aspect of the present disclosure provides a method for manufacturing a light emitting module in which the generation of a dark portion is reduced to improve light uniformity.

The light emitting module includes a circuit board having a plurality of reflective portions arranged in one direction and connection portions connecting the plurality of reflective portions; light emitting devices mounted on the plurality of reflective portions; and lens units disposed to cover the light emitting devices within boundaries of surfaces, of the plurality of reflective portions, on which the light emitting devices are mounted. A width of each of the connection portions in the other direction, perpendicular to the one direction thereof, is smaller than a diameter of each of the lens units.

A width of each of the reflective portions in the other direction may be greater than or equal to the diameter of each of the lens units.

A length of each of the reflective portions in one direction may be smaller than or equal to a length of each of the connection portions in one direction.

The reflective portions may be arranged at uniform intervals.

The reflective portions may have a circular shape, a triangular shape, a quadrangular shape, or a combination thereof when viewed from the surfaces on which the light emitting devices are mounted.

Each of the reflective portions may include a reflective layer disposed on the surfaces on which each of the light emitting devices is mounted.

Each of the connection portions may extend from one end portion of one reflective portion along the other direction to one end portion of a different reflective portion.

One end portion of each of the reflective portions may have a shape corresponding to one end portion of each of the connection portions.

Each of the connection portions may extend from one end portion of one reflective portion along the other direction to the other end portion of a different reflective portion.

One end portion of the one reflective portion may have a shape corresponding to the other end portion of each of the connection portion.

An aspect of the present disclosure provides a lighting device including: a circuit board having a plurality of reflective portions arranged in one direction and connection portions connecting the plurality of reflective portions; light emitting devices mounted on the plurality of reflective portions; lens units disposed to cover the light emitting devices within boundaries of surfaces, of the plurality of reflective portions, on which the light emitting devices are mounted; and one or more reflective sheets covering the circuit board and disposed to allow the lens units to be exposed therethrough. A width of each of the connection portions in the other direction, perpendicular to the one direction is smaller than a diameter of each of the lens units.

The lighting device may further include a chassis structure accommodating the circuit board and the reflective sheets.

The lighting device may further include one or more optical sheets disposed on the light emitting device.

The lens units may be coupled to insertion holes formed in positions corresponding to the lens units of the reflective sheet such that the lens units are exposed, and the insertion holes may be formed within the range of the reflective portions.

The plurality of circuit boards may be disposed vertically or horizontally on the chassis structure, wherein a reflective portion of one of the plurality of circuit boards may be disposed to be engaged with a connection portion of a different circuit board adjacent thereto.

Still another aspect of the present disclosure provides a light emitting module comprising: a circuit board having a plurality of reflective portions arranged along one direction and connection portions connecting the plurality of reflective portions; light emitting devices mounted on the plurality of reflective portions; and lens units disposed to cover the light emitting devices, within boundaries of surfaces, of the plurality of reflective portions, on which the light emitting devices are mounted. A width of each of the connection portions in the other direction, perpendicular to the one direction thereof, is smaller than a width of each of reflective portions in the other direction.

The width of each of the connection portions in the other direction is smaller than a diameter of each of the lens units.

The width of each of the reflective portions in the other direction is greater than or equal to the diameter of each of the lens units.

A length of each of the reflective portions in the one direction is smaller than or equal to a length of each of the connection portions in the one direction.

The reflective portions are arranged at uniform intervals.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Embodiments of the present disclosure will now be described in detail with reference to the accompanying drawings. The inventive concept may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 1:
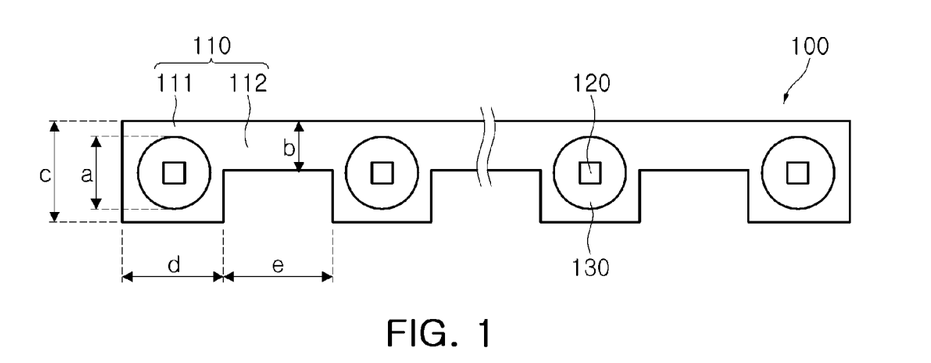
FIG. 1 is a schematic plan view of a light emitting module according to an embodiment of the present disclosure.

Hereinafter, a configuration of a light emitting module 100 according to an embodiment of the present disclosure will be described. FIG. 1 is a schematic plan view of a light emitting module according to an embodiment of the present disclosure. As illustrated in FIG. 1, the light emitting module 100 according to an embodiment of the present disclosure includes a circuit board 110, a light emitting device 120 mounted on the circuit board 110, and a lens unit 130 disposed to cover the light emitting device 120.

In the present embodiment, as illustrated in FIG. 1, the light emitting module 100 is configured such that the light emitting device 120 is mounted on the circuit board 110 and emits light to a light emitting surface thereof when an electrical signal is applied thereto. The light emitting surface of the light emitting device 120 refers to a main surface to which light is emitted among surfaces, and may not refer to all surfaces to which light is emitted. In the present embodiment, the light emitting surface may face upwardly from the circuit board 110 (i.e., a so-called a direct type).

The light emitting device 120 mounted on the circuit board 110 may be any device as long as it emits light when an electrical signal is applied thereto. Preferably, a light emitting diode (LED) may be used as the light emitting device 120. Typically, a semiconductor light emitting device in which a semiconductor layer is epitaxially grown on a growth substrate may be used. As the growth substrate, a sapphire substrate may be employed, but the present disclosure is not limited thereto and a known growth substrate such as a substrate made of spinel, SiC, GaN, GaAs, or the like, may be used. In detail, the light emitting device 120 may be made of BN, SiC, ZnSe, GaN, InGaN, InAlGaN, AlGaN, BAlGaN, BInAlGaN, or the like, and doped with silicon (Si), zinc (Zn), or the like. Also, a light emitting layer of the light emitting device 120 may be made of a nitride semiconductor including $In_xAl_yGa_{1-x-y}N$ ($0 \le X \le 1$, $0 \le Y \le 1$, $0 \le X+Y \le 1$), and may have a quantum well structure to enhance an output thereof. Here, the light emitting device 120 may be a nitride semiconductor device emitting light having a short wavelength ranging from 300 nm to 460 nm so that the light emitted therefrom may be converted into white light by a wavelength conversion material such as phosphors or quantum dots.

Also, a plurality of light emitting devices 120 may be provided and electrically connected. When the circuit board 110 has a bar-like shape, the plurality of light emitting devices 120 may be arranged in a length direction. In this case, the light emitting devices 120 may be mounted as chips on the circuit board 110 (which has a so-called chip-on-board (COB) structure) or may be packaged to be mounted on the circuit board 110. Namely, there is no limitation in the mounting method. Meanwhile, in FIG. 1, the light emitting device 120 has a hexahedral shape but it may have any shape as long as it can be coupled to the circuit board 110.

The lens unit 130 may be disposed to cover the light emitting device 120 within a range such that the lens unit 130 are located within the boundary of the surface on which the light emitting device 120 is mounted in a reflective portion 111 of the circuit board. Namely, the lens unit 130 is disposed within the reflective portion 111 when viewed from the light emitting surface.

The lens unit 130 may have a lens-like shape, and may have various lens surfaces to change an illumination distribution of light emitted from the light emitting device 120. In detail, when viewed from the light emitting surface, the lens unit 130 may have a circular shape but the present disclosure is not limited thereto and the lens unit 130 may have a polygonal shape such as triangular shape, a quadrangular shape, or the like. The lens unit 130 may be made of a transparent and translucent material and a component of the lens unit 130 is not particularly limited as long as the lens unit is light-transmissive. In detail, the lens unit 130 may be made of a light-transmissive resin such as a silicon resin composition, a modified silicon resin composition, an epoxy resin composition, a modified epoxy resin composition, or an acrylic resin composition. Also, a hybrid resin including one or more of silicon, epoxy, and a fluoride resin, or the like, may be used, and an inorganic substance such as glass, silica gel, or the like, may be applied. The lens unit 130 may be disposed on the reflective portion 111 through various methods such as insert-coupling, heat fusion (or thermosetting), bonding, or the like.

The circuit board 110 includes a plurality of reflective portions 111 arranged in one direction and a connecting portion 112 connecting the reflective portions 111. The circuit board 110 may have a bar-like shape elongated in one direction when viewed from a light emitting surface. The circuit board 110 having such a configuration may be arranged vertically or horizontally in a chassis structure of an LCD panel so as to appropriately emit a backlight. As the circuit board 110, a board, e.g., a printed circuit board (PCB), a metal-core PCB (MCPCB), a metal PCB (MPCB), a flexible PCB (FPCB), or the like, may be used. Also, the circuit board 110 may include connectors for transmitting and receiving electrical signals to and from the outside and wiring circuit patterns.

The reflective portion 111 is a region in which the light emitting device 111 is mounted. A plurality of reflective portions 111 are arranged in the length direction. When viewed from the light emitting surface, the reflective portion 111 may have an area sufficient for accommodating the lens unit 130 to come within the reflective portion 111, and reflects light emitted from the light emitting device 120 to increase luminous efficiency. In detail, a length (d) of the reflective portion 111 in the length direction or a width (c) of the reflective portion 111 in the width direction may be greater than or equal to a diameter (a) of the lens unit 130.

Figure 2:
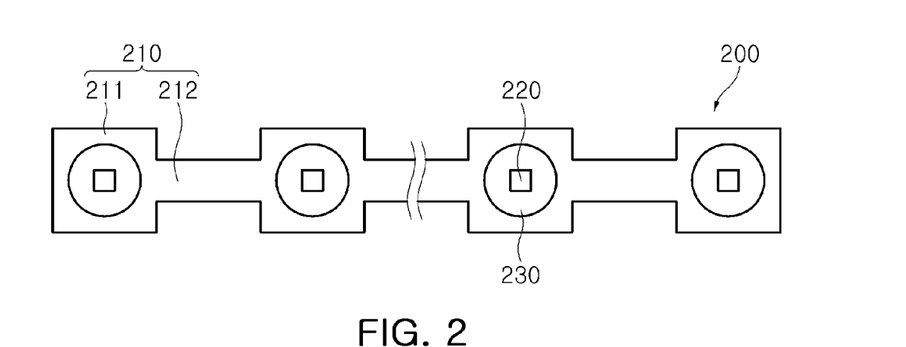
FIG. 2 is a view illustrating another embodiment of a circuit board of FIG. 1.
Figure 3:
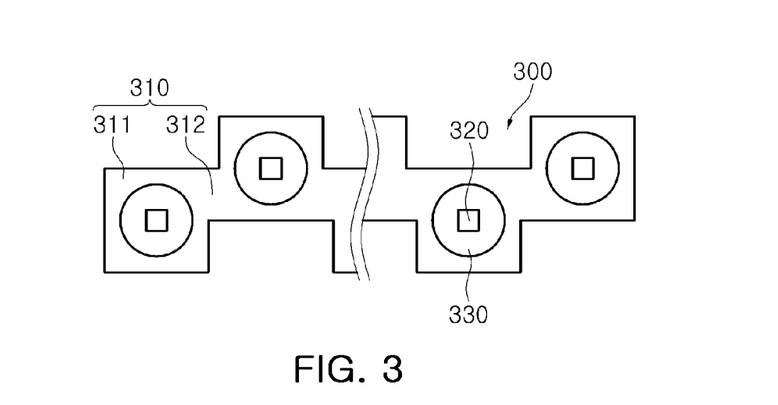
FIG. 3 is a view illustrating another embodiment of the circuit board of FIG. 1.
Figure 4:
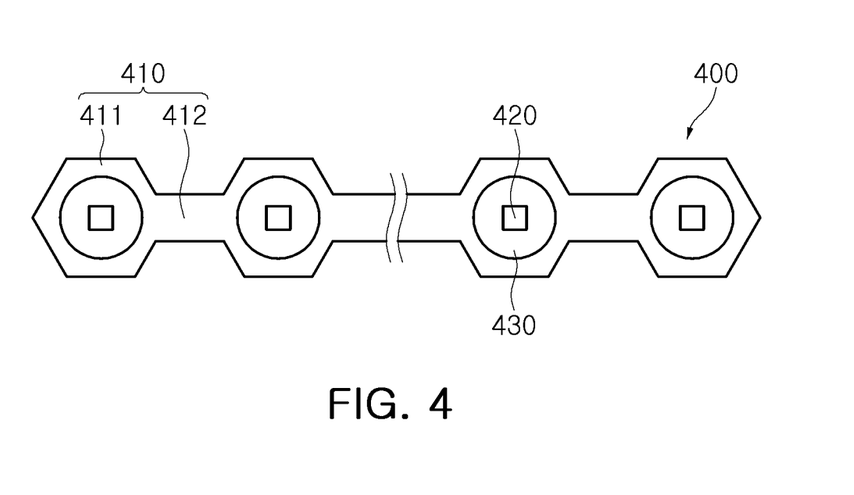
FIG. 4 is a view illustrating another embodiment of the circuit board of FIG. 1.

A configuration and disposition of the reflective portion 111 may be variously modified. For example, when viewed from the light emitting surface, the reflective portion 111 may have a circular shape, a triangular shape, a quadrangular shape, or a combination thereof. In detail, as illustrated in FIGS. 1 through 3, reflective portions 111, 211, and 311 may be formed, and as illustrated in FIG. 4, a hexagonal reflective portion 411 may be formed. In addition, a reflective portion may be formed to have a configuration in which irregular portions having a triangular shape or a trapezoid with a circumference having a circular shape, a triangular shape, a quadrangular shape, or a combination thereof are repeatedly protruded. The reflective portions 111 may be arranged at regular intervals, and when the reflective portions 111 are arranged at regular intervals, uniform light may be provided to the light emitting surface.

One or more light emitting diodes (LEDs) as the light emitting devices 120 may be mounted on one surface of the reflective portions 111. For example, in the present embodiment, one light emitting device 120 is mounted on one reflective portion 111. However, the present disclosure is not limited thereto, and a plurality of light emitting devices 120 may be mounted on one reflective portion 111 as necessary. The light emitting device 120 may be mounted in a central portion of the reflective portion 111, or may be mounted in a portion of the reflective portion 111 other than the central portion.

A reflective layer may be further formed on the surface of the reflective portion 111 in which the light emitting device 120 is mounted, to further enhance light reflecting efficiency of the circuit board 110. In detail, the reflective layer may be formed by coating a reflective material having high heat resistance one or more times, so that the reflective layer may have a high degree of reflectance even after a high temperature reflow process.

The connection portions 112 are regions connecting the plurality of reflective portions 111. A width of the connection portion 112 in the width direction is smaller than the diameter (a) of the lens unit 130. The connection portions 112 extend from one surface of the reflective portions 111 such that the plurality of reflective portions 111 are connected in a linear manner or a curved manner.

As illustrated in FIG. 1, the connection portion 112 may extend from one end portion of one reflective portion in the other direction, to one end portion of a different reflective portion. Namely, the connection portion 112 may be formed such that a recess portion is formed in one end portion of the circuit board 110 in the width direction.

As illustrated in FIG. 2, a connection portion 212 may be formed to connect central portions of the reflective portion 211 in the length direction. Namely, a recess portion may be formed in both end portions of the circuit board 210 in the length direction.

As illustrated in FIG. 3, a connection portion 312 may extend from one end portion of one reflective portion in the length direction to the other end portion of a different reflective portion.

As illustrated in FIG. 1, a width b of the connection portion 112 in the width direction may be smaller than the diameter (a) of the lens unit 130. When the connection portion 112 is smaller than the diameter (a) of the lens unit 130, an area of a used board can be reduced to reduce fabrication costs. In detail, an area of a used board may be reduced by approximately 30% or more relative to an existing bar-type circuit board. Thus, the larger area of the reflective portion 111 contributing to light reflection and the smaller connection portion 112 not contributing to light reflection allow a light emitting module to have enhanced light reflectivity and low fabrication cost.

Figure 7:
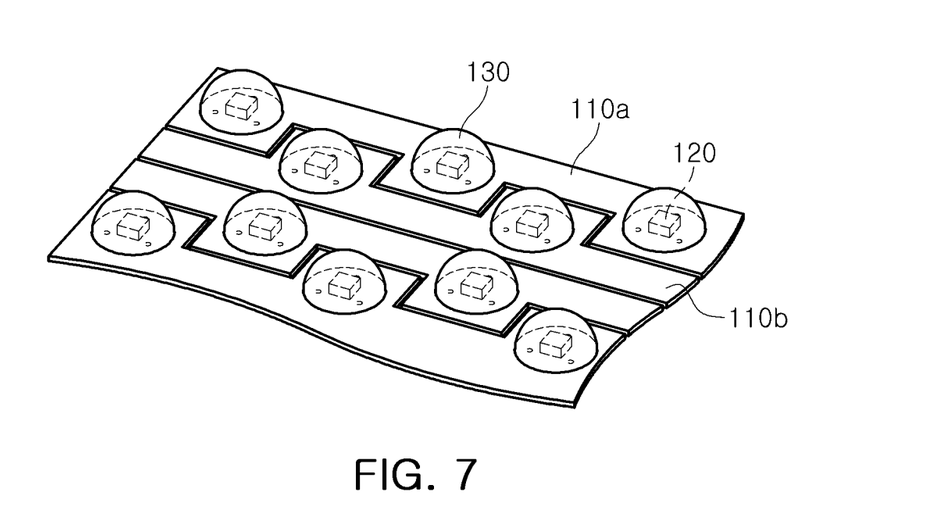

Here, one end portion may be formed to have a corresponding shape or one end portion of the reflective portion 111 and the other end portion of the connection portion 112 may have a corresponding shape. In this case, as illustrated in FIG. 7, a plurality of circuit boards 110a and 110b may be disposed to be engaged to allow a larger number of light emitting devices 120 to be disposed in the same space as that of the related art. Since a larger number of light emitting devices 130 are disposed in the same area, a quantity of light emitted to the light emitting surface is increased to increase luminance.

Figure 8:
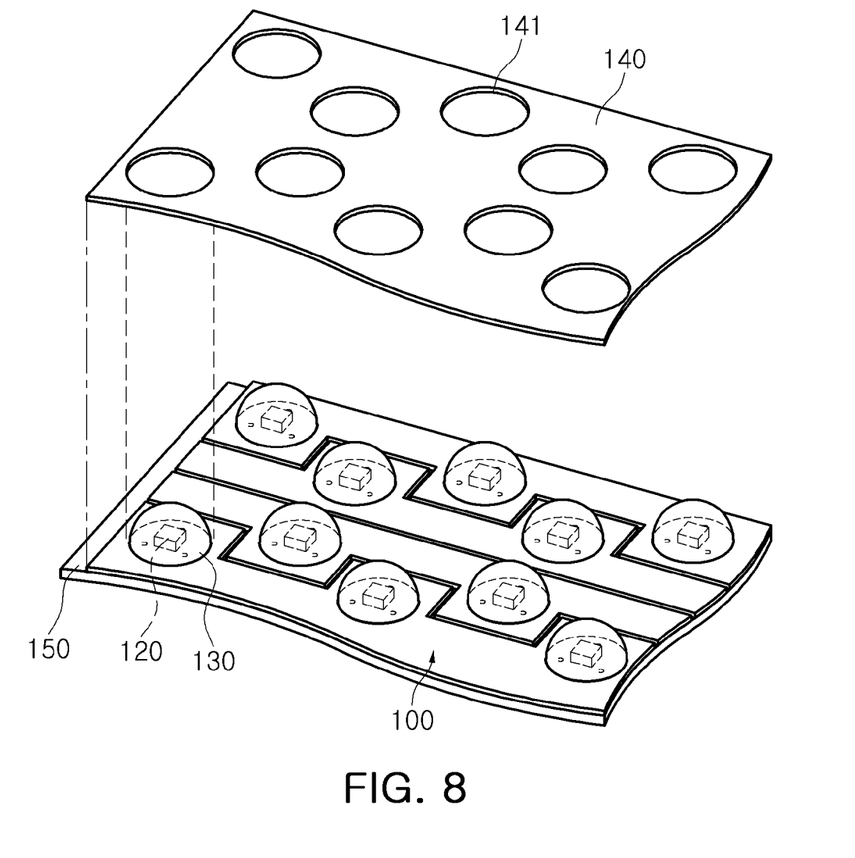
Figure 9:
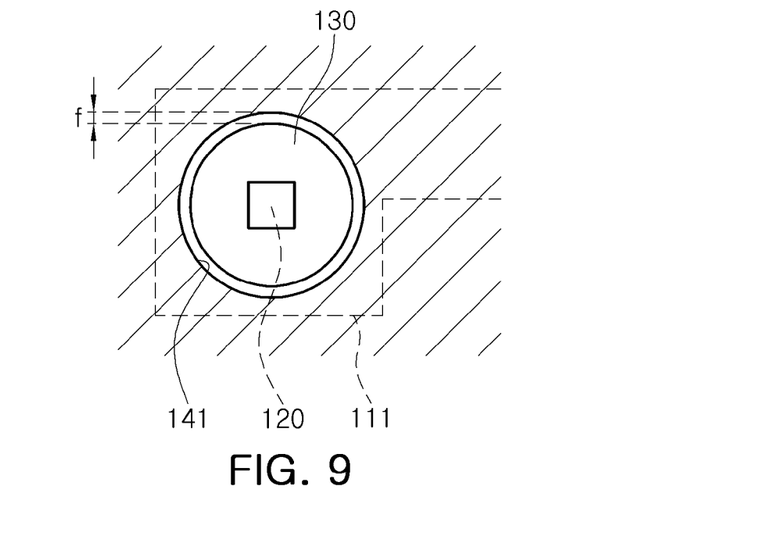

When the light emitting module 100 is used as a backlight unit of an LCD, as illustrated in FIG. 8, a reflective sheet 140 is coupled to the light emitting module 100. In detail, the lens unit 130 is coupled into an insertion hole 141 of the reflective sheet 100 so as to be exposed. Here, as illustrated in FIG. 9, a space (f) is formed between the outline of the lens unit 130 and the insertion hole 141 due to an error in a manufacturing process. Here, when a width of the reflective portion 111 is narrower than a diameter of the lens unit 130 to reduce manufacturing cost, there is a region in which emitted light is not reflected upwardly of the circuit board. Such a region is seen as a dark portion to which backlight is not illuminated on an LCD screen. In an embodiment of the present disclosure, the width (c) of the reflective portion 111 is greater than the diameter (a) of the lens unit 130, so the reflective portion 111 surrounds the circumference of the lens unit 130, reducing the generation of a dark portion.

The foregoing light emitting module 100 may be variously used in a backlight of an LCD, various indoor illumination devices, outdoor illumination devices such as a streetlight, an advertising sign, a beacon, and the like, and illumination devices of transportation means such as a head lamp, a taillight, or the like, of automobiles, airplanes, and ships.

Figure 10:
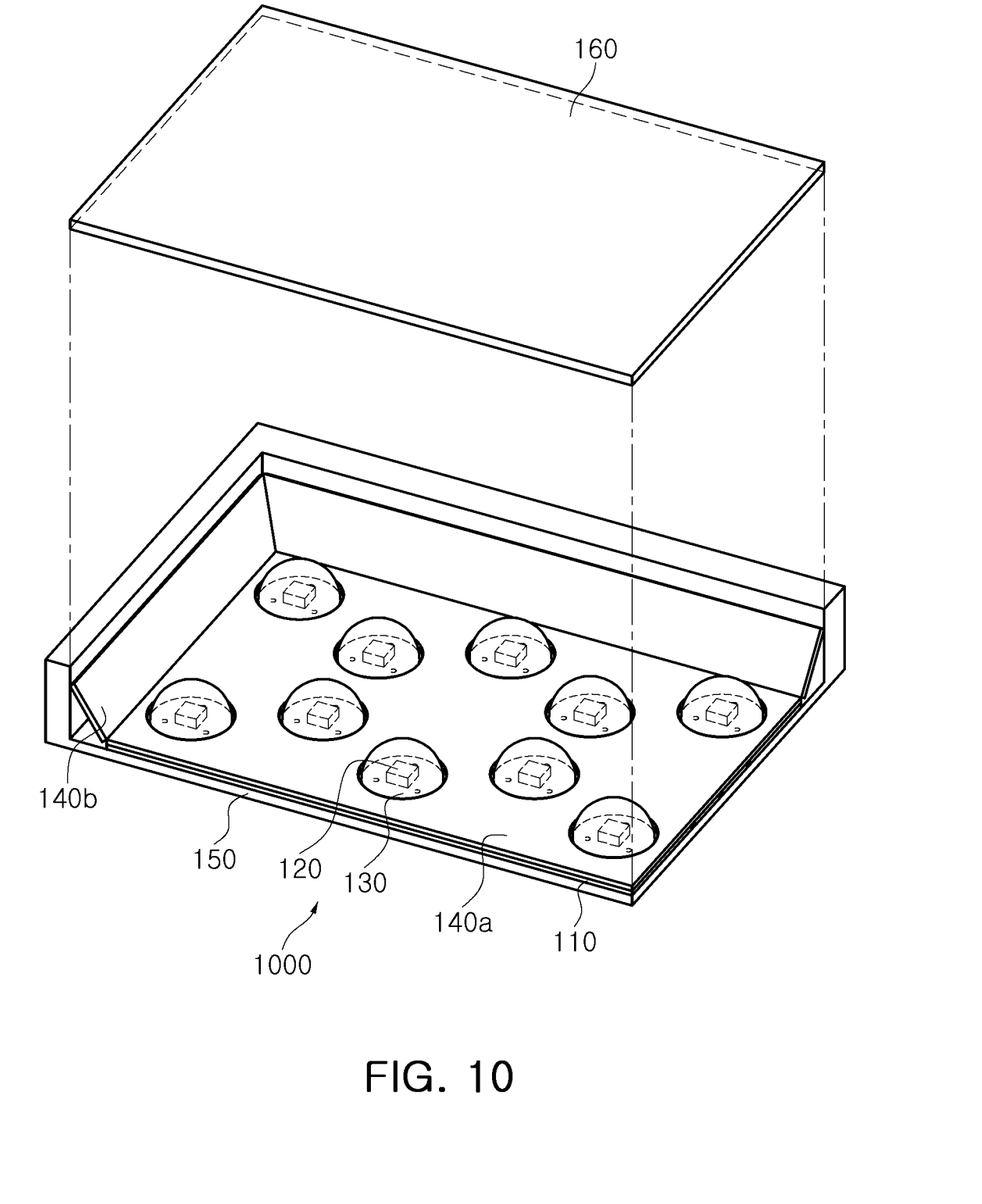
FIG. 10 is an exploded perspective view of a lighting device according to an embodiment of the present disclosure.

Hereinafter, a lighting device 1000 using the foregoing light emitting module 100 will be described. As illustrated in FIG. 10, the lighting device 1000 according to an embodiment of the present disclosure may include a circuit board 110, a light emitting device 120 mounted on the circuit board 110, a lens unit 130 disposed to cover the light emitting device 120, and a reflective sheet 140 covering the circuit board such that the lens unit 130 is exposed.

The lighting device 1000 may further include a chassis structure 150 accommodating the circuit board 110 and the reflective sheet 140. The chassis structure 150 may be a unit case of an LCD panel, and a plurality of light emitting devices 100 as described above may be disposed vertically or horizontally on the chassis structure 150. In detail, as illustrated in FIG. 8, a reflective portion of one circuit board 110a among the plurality of circuit boards 110 may be engaged with a connection portion of a different circuit board 110b adjacent thereto.

One or more transparent or translucent optical sheets 160 through which light emitted from the light emitting device 120 pass may be disposed above the chassis structure 150. The optical sheet 160 may be made of a transparent or translucent material and a component thereof is not particularly limited as long as it is light-transmissive. In detail, the optical sheet 160 may be made of a resin having light transmittance such as a silicon resin composition, a modified silicon resin composition, an epoxy resin composition, a modified epoxy resin composition, an acrylic resin composition, and the like. Also, the optical sheet 160 may be made of a hybrid resin including one or more of silicon, epoxy, and a fluoride resin, or the like, and a material of the optical sheet 160 may not be limited to an organic material and an inorganic material such as glass, silica gel, of the like, may also be applied.

The reflective sheet 140 may be made of a material having a high degree of reflectivity. The reflective sheet 140 is disposed on the circuit board 110 to reflect light emitted from the light emitting device 120. The reflective sheet 140 may include a bottom reflective sheet 140a disposed on the bottom of the chassis structure 150 and a lateral reflective sheet 140b disposed on the lateral surfaces of the chassis structure 150. The bottom reflective sheet 140a may reflect light beams emitted to the circuit board 110, among light beams emitted from the light emitting device 120, toward the light emitting surface. The lateral reflective sheet 140b reflects light emitted to the lateral surfaces, toward the light emitting surface, thus increasing a quantity of light emitted to the light emitting surface. Here, the lateral reflective sheet 140b may be disposed to be sloped at a predetermined angle with respect to the light emitting surface in order to reflect light emitted from the light emitting device 120 to the light emitting surface.

The lens unit 130 may be coupled to the insertion hole 141 formed in the reflective sheet 140 so as to be exposed. The insertion hole 141 may have a size sufficient for the lens unit 130 to be coupled to the reflective sheet 140, and may be formed within a range such that the lens unit 130 is not disposed outside of the boundary of the circuit board 110. The lens unit 130 is coupled to the insertion hole 141 such that the reflective portion 111 is exposed from the region (f) between the reflective sheet 140 and the lens unit 130 when viewed from the light emitting surface as illustrated in FIG. 9. As described above, in an embodiment of the present disclosure, the width (c) of the reflective portion 111 is greater than the diameter (a) of the lens unit 130 to allow the reflective portion 111 to surround the circumference of the lens unit 130. Thus, even in the case that the space (f) is formed between the insertion hole 141 of the reflective sheet 140 and the lens unit 130 due to a manufacturing error, the reflective portion 111 is exposed from the space (f). Thus, reflectance is reduced in the region between the insertion hole 141 and the lens unit 130, which reduces the generation of a dark portion on the light emitting surface, and thus, achieves a uniform light distribution of emitted light.

Next, a method for manufacturing the light emitting module 100 according to an embodiment of the present disclosure will be described.

FIGS. 5 through 9 are perspective views schematically illustrating a method for manufacturing the light emitting module 100 according to an embodiment of the present disclosure.

Figure 5:
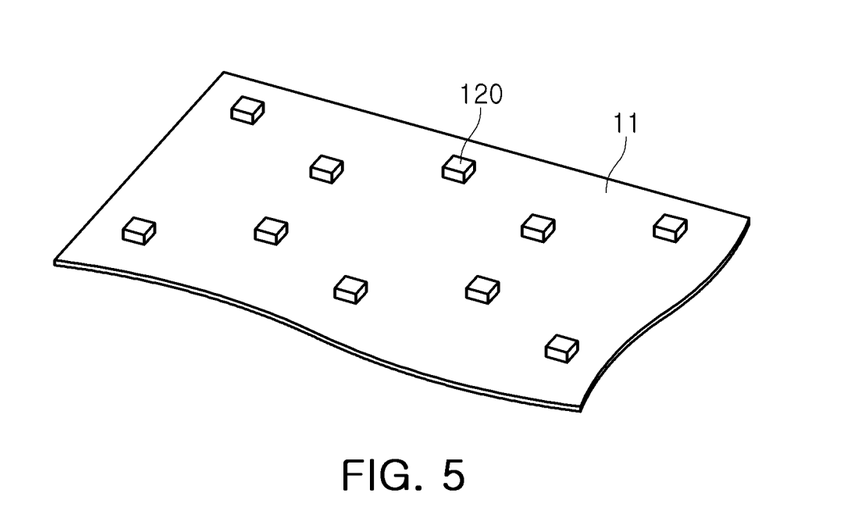
FIGS. 5 through 9 are perspective views schematically illustrating a method for manufacturing a light emitting module according to an embodiment of the present disclosure.

First, as illustrated in FIG. 5, a plurality of light emitting devices 120 are mounted on a bare substrate 11. The bare substrate 11 refers to a substrate before being cut into individual circuit boards 110. As described above, the light emitting devices 120 may be any devices as long as they can emit light when an electrical signal is applied thereto, and preferably, a light emitting diode (LED) may be used. Here, the plurality of light emitting devices 120 may be mounted to be disposed separately at predetermined intervals on the bare substrate 11.

Figure 6:
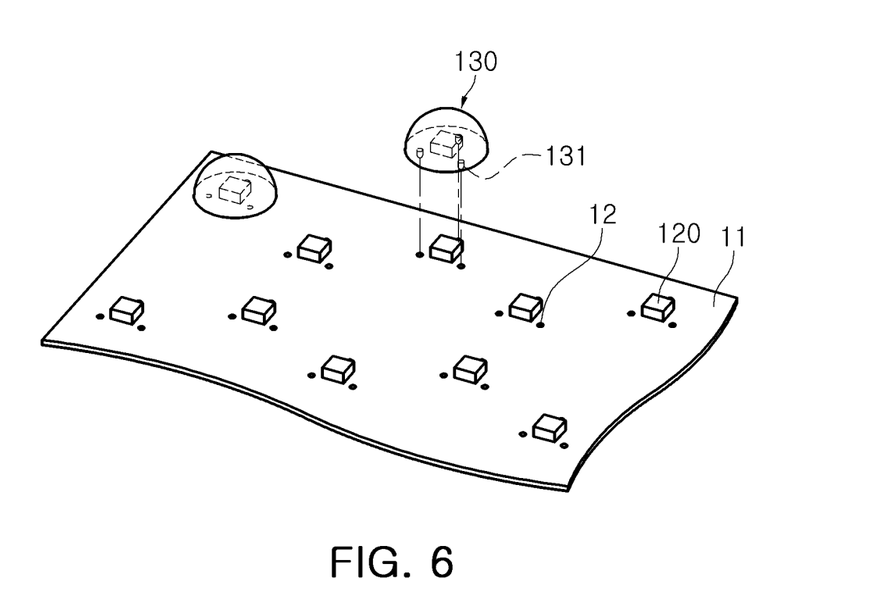

Next, as illustrated in FIG. 6, the lens units 130 are disposed on the bare substrate 11 to cover the light emitting devices 120. The lens units 130 may be disposed according to various methods. For example, coupling holes 12 may be formed on the bare substrate 11 and coupling protrusions 131 may be formed on the lens unit 130, and the coupling protrusions 131 may be inserted into the coupling holes 12 to dispose the lens units 130. Also, the lens units 130 may be heat-fused to the bare substrate 11 so as to be disposed, or frames having a shape of the lens units 130 in an intaglio form are attached to the light emitting devices 120 and a molding resin may be injected thereto to thus dispose the lens units 130.

Thereafter, as illustrated in FIG. 7, the bare substrate 11 is cut so as to be separated into individual circuit boards 110a and 110b. As described above, the bare substrate 11 is cut to form the individual circuit boards 110 having the plurality of reflective portions 111 and the connection portions 112 connecting the reflective portions 111. In this case, the bare substrate 11 may be cut to have a configuration in which the reflective portion of one circuit board 110a is engaged with a connection portion of a different circuit board 111b. When the bare substrate 11 is cut to have the configuration in which a pair of circuit boards are engaged, a larger number of circuit boards 110 can be manufactured with the same bare substrate 11, reducing manufacturing costs.

Thereafter, as illustrated in FIG. 8, the circuit board 110 is disposed on the chassis structure 150, and the reflective sheet 140 may be further coupled thereto. In detail, the lens unit 130 may be coupled to the insertion hole 141 of the reflective sheet 140, and in this case, the lens unit 130 is coupled to the insertion hole 141 such that the reflective portion 111 is exposed from the region (f) between the reflective sheet 140 and the lens unit 130 when viewed from the light emitting surface as illustrated in FIG. 9. As described above, the width (c) of the reflective portion 111 is greater than the diameter (a) of the lens unit 130, so the reflective portion 111 surrounds the circumference of the lens unit 130. Thus, even in the case that the space (f) is formed between the insertion hole 141 of the reflective sheet 140 and the lens unit 130 due to a manufacturing error, since the reflective portion 111 is exposed to the space (f), reflectance is not sharply reduced to thus reduce the formation of a dark portion on the LCD screen to which backlight is not illuminated.

As set forth above, according to embodiments of the disclosure, the generation of a dark portion is reduced to improve light uniformity.

While the present disclosure has been shown and described in connection with the embodiments, it will be apparent to those skilled in the art that modifications and variations can be made without departing from the spirit and scope of the inventive concept as defined by the appended claims.

What is claimed is:
1. A light emitting module comprising:
a circuit board having a plurality of relative portions arranged in one direction having a reflective material layer coating surfaces of each of the plurality of reflective portions, and having connection portions connecting the plurality of reflective portions;

light emitting devices mounted on the plurality of reflective portions; and lens units disposed, within boundaries of the plurality of reflective portions on which the light emitting devices are mounted to cover the light emitting devices, wherein a width of each of the connection portions in the other direction, perpendicular to the one direction, is smaller than a diameter of each of the lens units.

2. The light emitting module of claim 1, wherein a width of each of the reflective portions in the other direction is greater than or equal to the diameter of each of the lens units.

3. The light emitting module of claim 1, wherein a length of each of the reflective portions in the one direction is smaller than or equal to a length of each of the connection portions in the one direction.

4. The light emitting module of claim 1, wherein the reflective portions are arranged at uniform intervals.

5. The light emitting module of claim 1, wherein each of the reflective portions has a circular shape, a triangular shape, a quadrangular shape, or a combination thereof when viewed from the surfaces on which the light emitting devices are mounted.

6. The light emitting module of claim 1, wherein each of the connection portions extends from one end portion of one reflective portion along the one direction to a corresponding end portion of a different reflective portion.

7. The light emitting module of claim 6, wherein one end portion of each of the reflective portions has a shape corresponding to a shape of one end portion of each of the connection portions.

8. The light emitting module of claim 1, wherein each of the connection portions extends from one end portion of one reflective portion along the one direction to an opposing end portion of a different reflective portion.

9. The light emitting module of claim 8, wherein one end portion of the one reflective portion has a shape corresponding to a shape of the other end portion of each of the connection portion.

10. The light emitting module of claim 1, wherein the circuit board having the connections portions having the width smaller than the diameter of the lens units further has connectors for transmitting and receiving electrical signals.

11. A lighting device comprising:
a circuit board having a plurality of reflective portions arranged along one direction and connection portions connecting the plurality of reflective portions;
light emitting devices mounted on the plurality of reflective portions;
lens units disposed to cover the light emitting devices within boundaries of surfaces, of the plurality of reflective portions, on which the light emitting devices are mounted; and
one or more reflective sheets covering the circuit board and disposed to allow the lens units to be exposed therethrough, wherein a width of each of the connection portions in the other direction, perpendicular to the one direction is smaller than a diameter of each of the lens units.

12. The lighting device of claim 11, further comprising:
a chassis structure accommodating the circuit board and the reflective sheets.

13. The lighting device of claim 11, further comprising:
one or more optical sheets disposed on the light emitting device.

14. The lighting device of claim 11, wherein the lens units are coupled to insertion holes disposed in positions corresponding to the lens units of the reflective sheet such that the lens units are exposed, and the insertion holes are formed within the boundaries of the reflective portions.

15. The lighting device of claim 12, wherein the circuit board is disposed vertically or horizontally on the chassis structure, wherein another circuit board is disposed adjacent to the circuit board on the chassis structure, and wherein a reflective portion of the circuit board is disposed to be engaged with a connection portion of the other circuit board adjacent thereto.

16. A light emitting module comprising:
a circuit board having a plurality of reflective portions arranged along one direction and connection portions connecting the plurality of reflective portions;
light emitting devices mounted on the plurality of reflective portions; and
lens units disposed within boundaries of the plurality of reflective portions on which the light emitting devices are mounted to cover the light emitting devices,
wherein a width of each of the connection portions in the other direction, perpendicular to the one direction, is smaller than a width of each of reflective portions in the other direction, and the width of each of the reflective portions in the other direction is greater than or equal to the diameter of each of the lens units.

17. The light emitting module of claim 16, wherein the width of each of the connection portions in the other direction is smaller than a diameter of each of the lens units.

18. The light emitting module of claim 16, wherein a length of each of the reflective portions in the one direction is smaller than or equal to a length of each of the connection portions in the one direction.

19. The light emitting module of claim 16, wherein the reflective portions are arranged at uniform intervals.

20. The light emitting module of claim 16, wherein the circuit board further has a reflective material layer coating a surface of each of a plurality of reflective portions.

* * * * *